United States Patent [19]

Kim et al.

[11] Patent Number: 5,132,251
[45] Date of Patent: Jul. 21, 1992

[54] METHOD FOR MANUFACTURING A COLOR FILTER

[75] Inventors: Seung G. Kim, Jinhae; Han S. Park, Suweon, both of Rep. of Korea

[73] Assignee: Samsung Electronics Co., Ltd., Suweon, Rep. of Korea

[21] Appl. No.: 703,372

[22] Filed: May 21, 1991

[30] Foreign Application Priority Data

Dec. 31, 1990 [KR] Rep. of Korea ............ 90-22670

[51] Int. Cl.$^5$ ............... H01L 21/302; H01L 21/463
[52] U.S. Cl. ........................... 437/225; 427/2; 427/3; 427/4; 357/30; 358/41; 358/44
[58] Field of Search ............... 437/225, 2, 3, 4; 357/30 L, 30 M; 250/208.1; 358/41, 44, 2, 3, 23, 2.3, 26

[56] References Cited

U.S. PATENT DOCUMENTS

| | | | |
|---|---|---|---|
| 4,667,092 | 5/1987 | Ishihara | 250/208.1 |
| 4,721,999 | 1/1988 | Takemura et al. | 358/41 |
| 4,786,817 | 11/1988 | Tei | 358/44 |
| 4,882,616 | 11/1989 | Manabe | 358/41 |
| 4,920,075 | 4/1990 | Morita | 357/30 L |
| 4,994,907 | 2/1991 | Allen | 358/41 |
| 5,028,547 | 7/1991 | Iizuka et al. | 358/44 |

FOREIGN PATENT DOCUMENTS

| | | | |
|---|---|---|---|
| 61-88558 | 5/1986 | Japan | 357/30 L |
| 61-199659 | 9/1986 | Japan | 357/30 M |
| 63-86481 | 4/1988 | Japan | 357/30 L |
| 2-69978 | 3/1990 | Japan | 357/30 L |

Primary Examiner—Brian E. Hearn
Assistant Examiner—Kevin Picardat
Attorney, Agent, or Firm—Ladas & Parry

[57] ABSTRACT

The present invention can form lenses with a small radius of curvature by using surface tension due to heat and gravity and by directing the spherical surfaces of lenses downward during thermal processing at a constant temperature.

In addition, the present invention can control a distance between lenses in a step of forming lens patterns since the molten lens material during the thermal processing is not extended along the surface of the highest interlayer. Thus, thick lenses with a small radius of curvature can be easily obtained by gravity and a distance between lenses can accurately be controlled.

3 Claims, 2 Drawing Sheets

METHOD FOR MANUFACTURING A COLOR FILTER

BACKGROUND OF THE INVENTION

The present invention relates to a method for manufacturing a color filter and more particularly to a method that can easily form a lens with a small radius of curvature.

In recent years, solid state image sensing devices which are able to replace an electron tubes and thus are spotlighted as the image sensing device of the next generation can achieve the color by forming the color filter at the upper side of optical-to-electrical converting region.

In such a prior art solid state image sensing devices, MOS transistors, photo transistors, and CCD's (Charge Coupled Devices) are widely used.

In case of CCD's which is mainly used in a small-sized movie cameras, a large number of pixels and high sensitivity are demanded and thus a technology to form the lens for condensing the light on the color filter is developing.

Similarly, LCD's (Liquid Crystal Displays) achieve the colorful image by forming the color filter on the optical-to-electrical converting region.

There are divided into two kinds according to the components. One is an organic filter which are made by dyeing organic matters such as casein and gelatin and the other is an inorganic filter which utilizes the optical interference phenomenon. In particle, the organic filter is more widely used than the inorganic one since the organic filter is a moderate prices rather than the inorganic one.

FIG. 1(A)-(C) are series of cross sectional views of processes for manufacturing a conventional color filter for a CCD.

In FIG. 1(A), there is a CCD where a silicon substrate 1 has a concave and convex surface and photodiodes 2, 3, and 4 are formed in a matrix shape on the concave portions of surface, while conducting and insulating layers 5 and 7 are formed on the convex portions of surface.

A flatting layer 9 is formed on the surface of the CCD by using a transparent material such as polyimide and on this flatting layer 9, a dyed layer 11, which is made of casein comprising $(NH_4)_2Cr_2O_1$ or gelatin comprising $(NH_4)_2Cr_2O_1$ and is colored with dyestuffs, is formed corresponding to the photodiode 2.

At this time, the layer 11 is dyed with one of the materials such as magenta, cyan, and yellow. Subsequently, an interlayer 13 is formed by deposition of polyimide.

Referring to FIG. 1(B), the dyed layers 15, 19 and an interlayers 17, 21 are sequentially formed on the interlayer 13 in the same manner as described above. The interlayers 17 and 21 is used to prevent the mixing of colors of the dyed layers 15 and 19.

Next, a layer for a lens, which is made of acrylate material, is formed on the entire surface of the interlayer 21 and then lens patterns 23 are formed by exposure and development process with a desired distance $l_1$.

As shown in FIG. 1(C), by annealing the lens patterns 23, lenses 25, 26, and 27 which corresponds respectively to the photodiodes 2, 3, and 4 are formed. The annealing is sequentially carried out from low to high temperature.

By this thermal processing, the edge portions of the lens patterns 23 are molten and subsequently the top sides of the lens patterns 23 are bulged like a spherical surface by surface tension and gravity, while the bottom sides are extended, thereby forming the lenses 25, 26, and 27 apart from each other with a desired distance $l_2$.

As a materials forming lenses affect the effect of gravity rather than the surface tension by the thermal, when the lenses are formed by the thermal processing, it is difficult to obtain thick lenses with a small radius of curvature.

Also, the lens materials to be formed by the thermal treatment are extended during the thermal processing, so that the distance between the lenses is difficult to control precisely.

SUMMARY OF THE INVENTION

The present invention has been made in consideration of this and has it for object to provide a method for manufacturing a color filter, which forms easily thick lenses with a small radius of curvature.

Another object of this invention is to a method for manufacturing a color filter, which is able to control accurately the distance between the lenses.

According to this invention, there is provided a method for manufacturing a color filter on a semiconductor substrate, comprising the steps of: forming flatting layer on the surface of a semiconductor substrate, forming a dyed layers which correspond to each pixel on the surface thereof and forming an interlayer on said dyed layers, repeating said second process two times at least, forming a lens patterns, which corresponds to each pixel, on the highest interlayer, forming a lenses by thermal-processing after putting the lens patterns downward.

BRIEF DESCRIPTION OF THE DRAWINGS

These and other objects, features, and advantages of the present invention will become more apparent from the following description for the preferred embodiments taken in conjunction with the accompany drawings, in which.

DETAILED DESCRIPTION OF THE INVENTION

The present invention will now be described in more detail with reference to accompanying drawings.

Figure 1A:
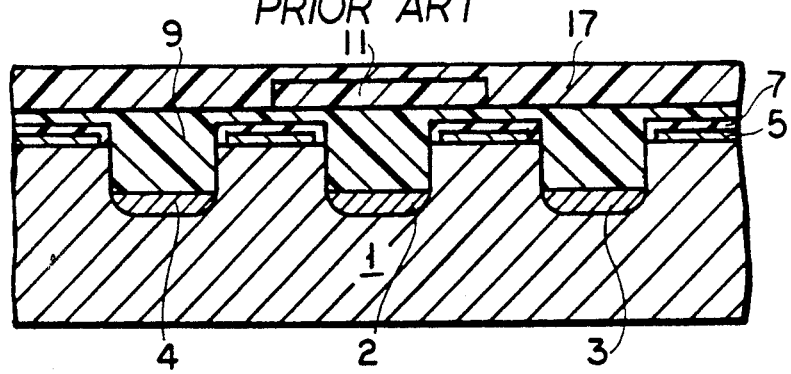
FIGS. 1(A)-1(C) are cross sectional views showing processes for manufacturing a conventional color filter for a CCD.
Figure 1B:
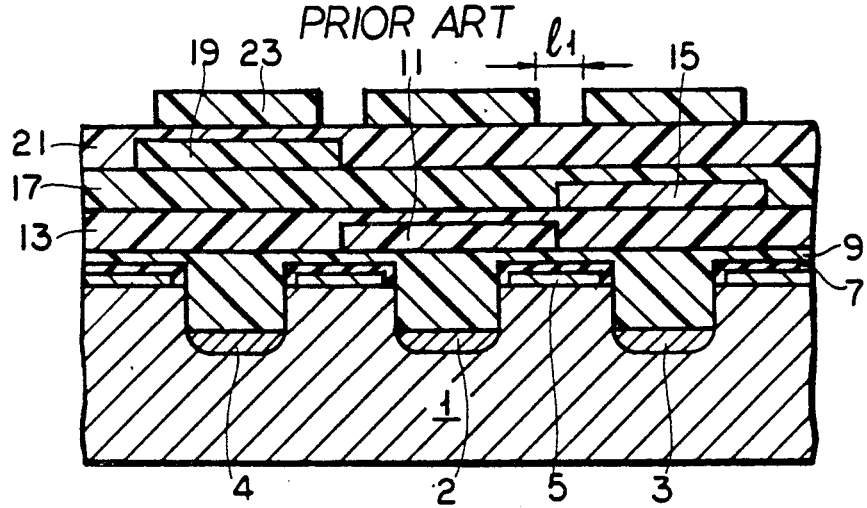
Figure 1C:
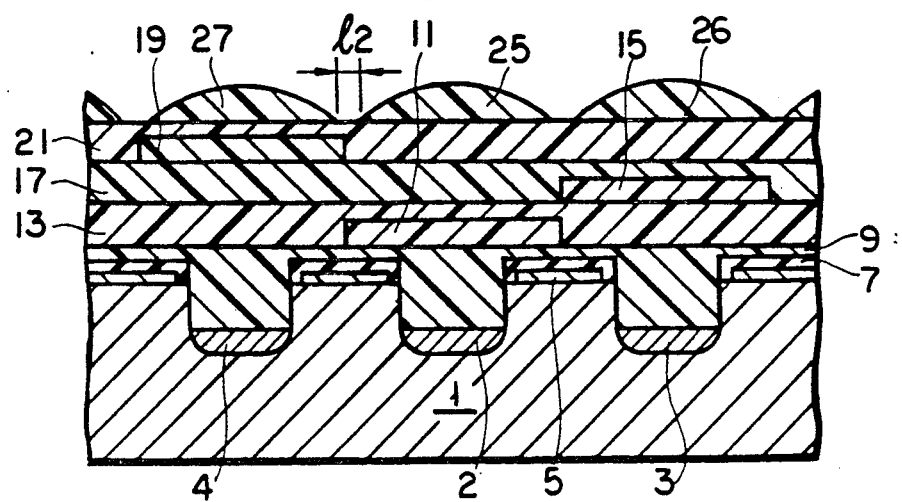
Figure 2A:
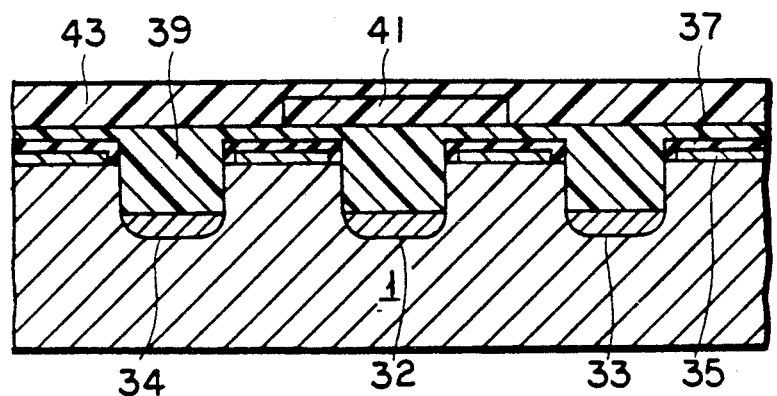
FIGS. 2(A)-2(C) are cross sectional views showing processes for manufacturing a color filter of the present invention.
Figure 2B:
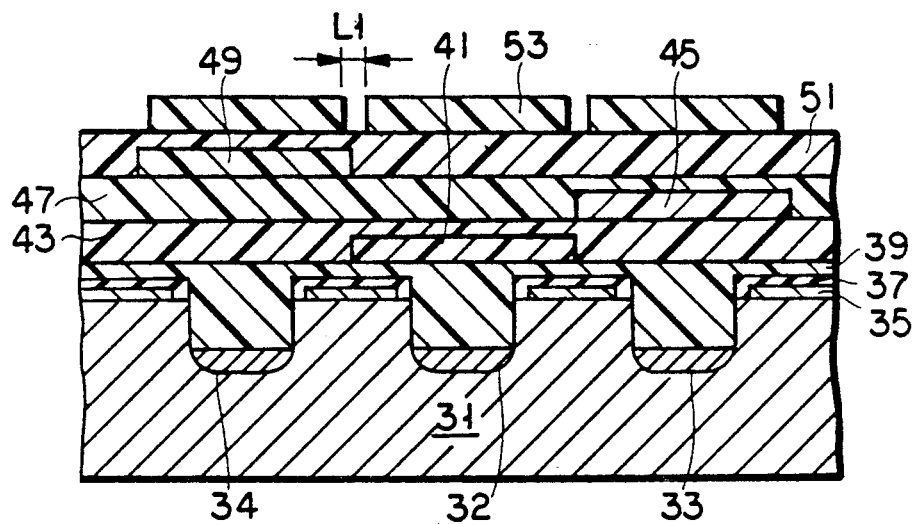
Figure 2C:
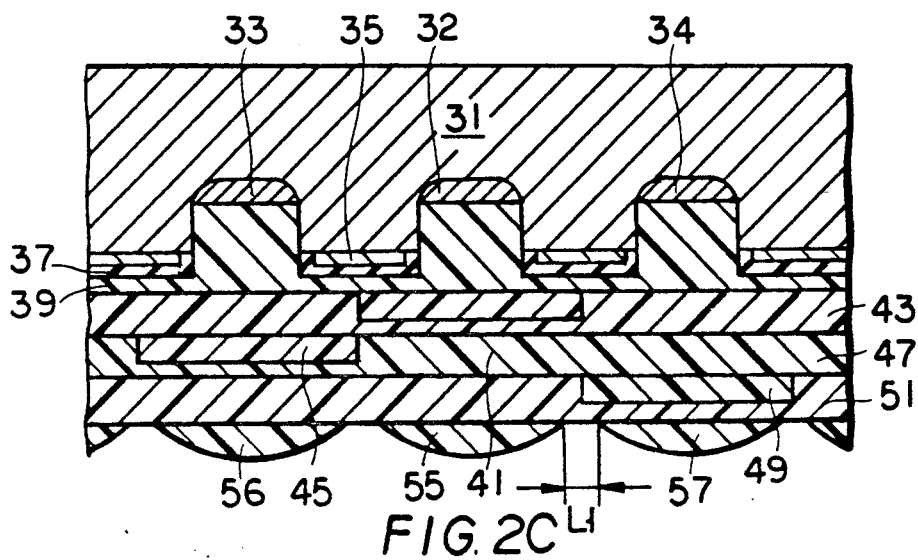

FIGS. 2(A)~2(C) show the manufacturing steps of a color filter according to the present invention.

In FIG. 2(A), the surface of a silicon substrate 31 has a concave and convex structure and on the concave portions, first, second, and third photodiodes 32, 33, 34 are made in a matrix form, while on the convex portions a distribution conducting film 35 such as aluminum and an insulating film 37 such as $SiO_2$ are formed.

On the surface of a CCD shown in FIG. 2 (A), a flatting layer 39 of 3000 Å is formed by deposition of a transparent material such as polyimide.

Subsequently, after deposition a casein comprising $H_2Cr_2O$ or a mixture of gelatin comprising $(NH_4)_2Cr_2O$ by a thickness of 4000~7000 Å at the upper part of the flatting layer 39, a pattern is formed on the position facing the first photodiode 32 by the conventional photolithography process and then a first dyed layer 41 is formed by deposition of a dyestuff on the entire surface of the structure.

The first dyed layer 41 is formed by reaction of the dyestuff with the pattern and the dyestuff on the flatting layer 39 is removed by deionized water.

At this time, the layer 41 is dyed by one of magenta, cyan, and yellow to analize one of colored lights. That is, the magenta is used as a dyestuff so that the first dyed layer 41 obtains the magenta spectrum of light.

Next, a first interlayer 43 of 1 μm, which is made of the same material as the first flatting layer 39, is formed on the entire surface of the structure.

In FIG. 2(B), after forming the dyestuff patterns on the upper part of the first interlayer 43 corresponding to the second and third photodiodes in the same manner as the case of the first dyed layer 41, second and third dyed layers 45 and 49 are formed by reaction of dyestuffs with the patterns.

At this time, the cyan and yellow are used as dyestuffs to obtain the cyan and yellow spectrums.

Also, second and third interlayers 47 and 51 are formed on the second and third dyed layers 45 and 49, respectively, in the same manner as the case of the first interlayer 43.

Next, a material such a acrylate is deposited on the third interlayer 51 and subsequently lens patterns 53 apart from each other with a desired distance of $L_1$ are formed by exposure and development process.

In FIG. 2 (C), after the lens patterns are directed downward, the first, second, and third lenses 55, 56, and 57 are formed by the thermal processing. The thermal process is only once carried out at a constant temperature.

Then, the lens patterns 53 begin to melt from the edge parts and thus the thick lenses with a small radius of curvature are formed by the surface tension due to heat and the gravity.

Also, the molten lens material during the thermal processing is not extended along the surface of the third interlayer 51 due to the gravity, so that a distance $L_1$ between the lenses is kept constant.

As mentioned up to now, by directing the spherical surface of lens downward during the thermal processing, the thick lenses with a small radius of curvature can be formed by the interaction of the surface tension due to heat and the gravity.

Also, the molten lens material during the thermal processing is not extended along the surface of the interlayer and thus the distance between the lenses can be accurately adjusted when the lens patterns are formed.

Thus, the present invention can easily form a thick lenses with a small radius of curvature due to the gravity and can accurately control a distance between the lenses.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A method for manufacturing a color filter on a semiconductor substrate where many pixels were formed in a matrix form, comprising the steps of:

.forming a flatting layer on a semiconductor substrate, forming a dyed layers which correspond to each pixel on the surface thereof and forming interlayers on said dyed layers, respectively, repeating said second step two times at least, forming a lens patterns, which corresponds to each pixel, on the highest interlayer, and forming a lenses by thermal processing after putting said lens patterns downward.

2. The method according to claim 1, wherein said thermal processing is once carried out at a constant temperature.

3. The method according to claim 1, wherein a distance between said lenses is controlled when said lens patterns are formed.

* * * * *